United States Patent [19]
Yano

[11] Patent Number: 6,094,088
[45] Date of Patent: Jul. 25, 2000

[54] RADIO FREQUENCY SWITCH CIRCUIT HAVING RESISTORS CONNECTED TO BACK GATES OF TRANSISTORS

[75] Inventor: Hitoshi Yano, Tokyo, Japan

[73] Assignee: NEC Corporation, Tokyo, Japan

[21] Appl. No.: 09/030,777

[22] Filed: Feb. 26, 1998

[30] Foreign Application Priority Data

Feb. 26, 1997  [JP]  Japan .................................. 9-041275

[51] Int. Cl.$^7$ .................................................... H03K 3/01
[52] U.S. Cl. ........................................... 327/534; 327/537
[58] Field of Search ..................................... 327/534–537

[56] References Cited

U.S. PATENT DOCUMENTS

| | | | |
|---|---|---|---|
| 4,717,836 | 1/1988 | Doyle ..................................... | 327/543 |
| 5,546,040 | 8/1996 | McCall et al. .......................... | 327/479 |
| 5,892,262 | 4/1999 | Wu et al. ................................ | 257/356 |

FOREIGN PATENT DOCUMENTS

| | | |
|---|---|---|
| 6-188630 | 6/1994 | Japan . |
| 7-235802 | 9/1995 | Japan . |

OTHER PUBLICATIONS

H. Uda et al., "Miniaturization and High Isolation of a GaAs SPDT Switch IC Mounted in Plastic Package", Technical Report of ICICE, ED95–165, MW95–150, ICD95–221 (1996).

Y. Ikeda et al., "A Novel Resonant–type GaAs SPDT Switch IC with Low Distortion Characteristics for 1.9 GHz Personal Handy–Phone System", Technical Report of ICICE, ED96–5 SDM96–42, ICD96–62 (1996).

Y. Iyama et al, "L–Band SPDT Switch using Si–MOSFET", Technical Report of IEICE, SAT95–82, NW95–124, (1995).

Robert J. Caverly, "Distortion in GaAs MESFET Switch Circuits", Microwave Journal, pp. 106–114, Sep. 1994.

K. Miyatsuji et al, "A GaAs High Power RF Single Pole Dual Throw Switch IC for Digital Mobile Communication System", IEEE Journal of Solid–State Circuits, vol. 30, No. 9, pp. 979–983 Sep. 1995.

Y. Ota et al., High Isolation and Low Insertion Loss Switch IC Using GaAs MESFET IEEE Trans. of Microwave and Techniques, vol. 43, No. 9, pp. 2175–2177, Sep. 1995.

*Primary Examiner*—Kenneth B. Wells
*Attorney, Agent, or Firm*—Sughrue, Mion, Zinn, Macpeak & Seas, PLLC

[57] ABSTRACT

In a switch circuit, at least one transistor has a source, a drain, a gate for receiving a control voltage and a back gate. At least one resistor is connected between the back gate of the transistor and a ground terminal.

16 Claims, 16 Drawing Sheets

RADIO FREQUENCY SWITCH CIRCUIT HAVING RESISTORS CONNECTED TO BACK GATES OF TRANSISTORS

BACKGROUND OF THE INVENTION

1. Field of the Invention

The present invention relates to a switch circuit, and more particularly, a radio frequency switch circuit formed by MOS transistors or junction field effect transistors using silicon.

2. Description of the Related Art

As switch circuits for radio frequency such as a single pole dual throw (SPDT) switch circuit or a double pole dual throw (DPDT) switch circuit, GaAs field effect transistors (FETS) have been used (see: Robert H. Carevly, "Distortion in GaAS MESFET Switch Circuits", Microwave Journal, pp. 106–114, September (1994)).

The switch circuit using GaAs FETs is very simple and therefore, can be constructed by one semiconductor chip. Also, since the mutual conductance $g_m$ and the transition frequency $f_t$ of GaAs FETs are very high, the characteristics of the switch circuits can be enhanced. This will be explained later in detail.

On the other hand, the gate length of MOS transistors or junction FETs using silicon has become fine. For example, such a gate length is less than 1 $\mu$m. Therefore, the mutual conductance $g_m$ and the transition frequency $f_t$ of MOS transistors or junction FETs using silicon are also very high. Since silicon is less expensive than GaAs, and switch circuits using silicon can be easily integrated into other integrated circuits, switch circuits using silicon are preferable.

However, if the GaAs FETs of the above-mentioned radio frequency switch circuit are simply replaced by MOS transistors or junction FETs using silicon, the transmission loss of radio frequency signals is remarkably increased which will be explained later in detail.

SUMMARY OF THE INVENTION

It is an object of the present invention to provide a switch circuit for radio frequency signals, capable of decreasing the transmission loss of radio frequency signals.

According to the present invention, in a switch circuit, at least one transistor has a source, a drain, a gate for receiving a control voltage and a back gate. At least one resistor is connected between the back gate of the transistor and a ground terminal. Thus, if the impedance of the resistor is sufficiently larger than the capacitances between the source (or drain) and back gate of the transistor, the transmission loss is decreased.

BRIEF DESCRIPTION OF THE DRAWINGS

The present invention will be more clearly understood from the description as set forth below, as compared with the prior art, with reference to the accompanying drawing, wherein.

DESCRIPTION OF THE PREFERRED EMBODIMENTS

Before the description of the preferred embodiments, prior art SPDT switch circuits will be explained with reference to FIGS. 1, 2, 3A, 3B, 4, 5, 6A and 6B.

In FIG., 1, which illustrates a GaAs SPDT switch circuit (see: Robert H. Carevly, "Distortion in GaAs MESFST Switch Circuits", Microwave Journal, pp. 106–114, September 1994), GaAs FETs 1 and 2 are connected in series between input ports IN1 and IN2. Also, a GaAs FET 3 is connected between the input port IN1 and a ground terminal GND, and a GaAs FET 4 is connected between the input port IN2 and the ground terminal GND. Further, resistors 5, 6, 7 and 8 are connected to gates of the FETs 1, 2, 3 and 4, respectively. Complementary control voltages $V_c$ and $\overline{V}_c$ are applied via the resistors 5 to 8 to the gates of the FETs 1 to 4. In this case, the voltage $V_c$ is applied to the gates of the FETs 2 and 3, while the voltage $\overline{V}_c$ is applied to the gates of the FETs 1 and 4. Since the FETs 1 to 4 serve as passive elements, bias circuits for operating the FETs 1 to 4 as active elements are unnecessary. Also, since a substrate of the GaAs FETs is made of semi-insulating material, each of the GaAs FETs is of a three-terminal type which has a source S, a drain D and a gate G. Therefore, as illustrated in FIG. 2, each of the GaAs FETs is can be represented by a resistor between the source S and the drain D, a capacitor between the source S and as the gate G, and a capacitor between the drain D and the gate G. Thus, the switch of FIG. 1 is very simple and therefore, can be constructed by one semiconductor chip.

Figure 1:
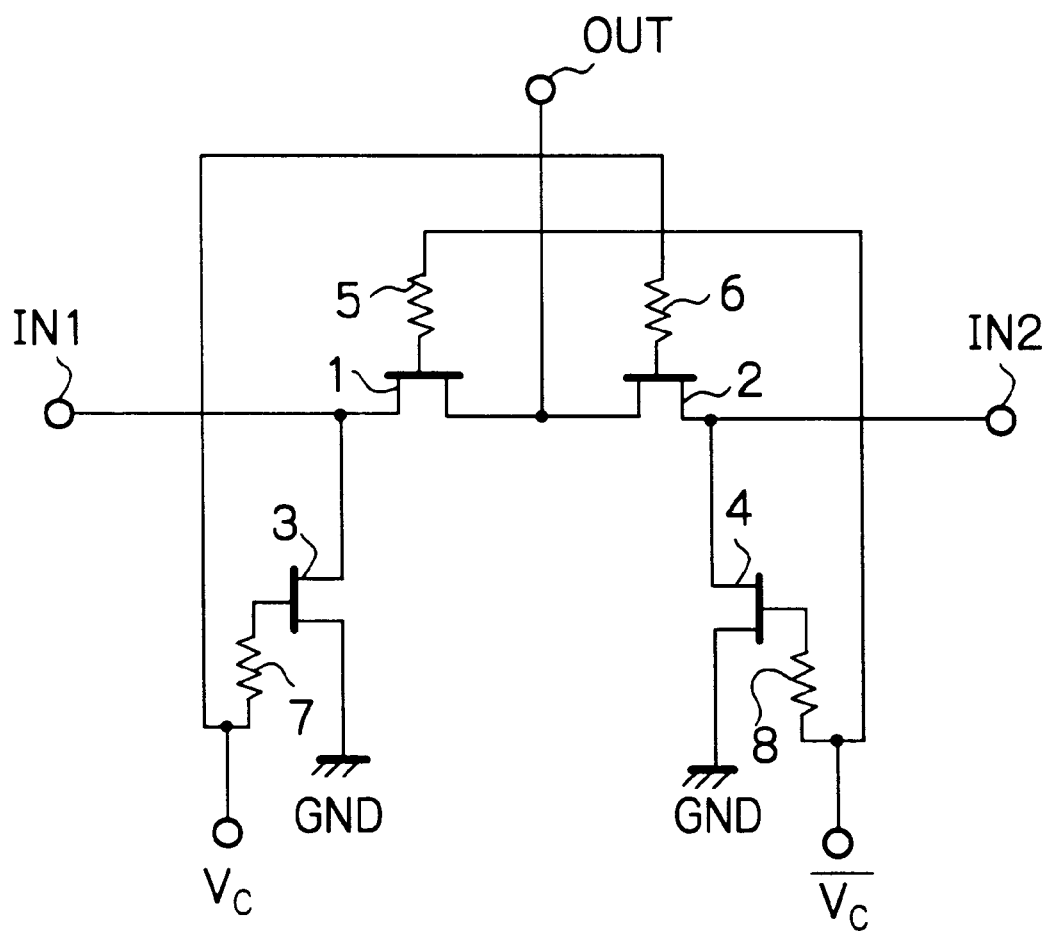
FIG. 1 is a circuit diagram illustrating a prior art GaAs SPDT switch circuit.
Figure 2:
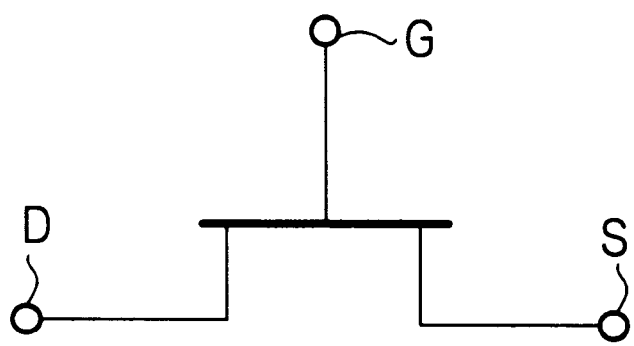
FIG. 2 is an equivalent circuit diagram of the GaAs FET of FIG. 1.
Figure 2:
Figure 2:
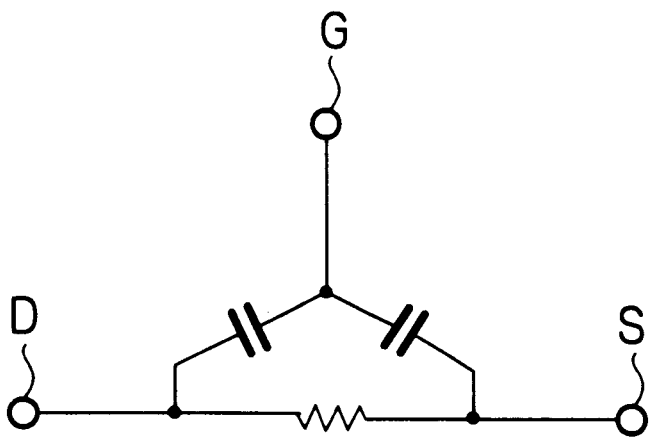
Figure 3A:
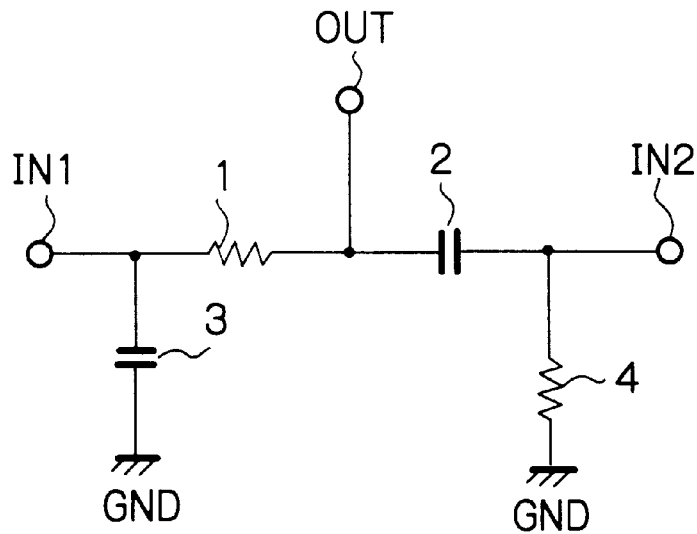
FIGS. 3A and 3B are equivalent circuit diagrams of the switch circuit of FIG. 1.

In FIG. 1, when $\overline{V}_c$="1" (high), the FETs 1 and 4 are turned ON while the FETs 2 and 3 are in a high impedance state, so that the input port IN1 is connected to the output port OUT, as illustrated in FIG. 3A. On the other hand, when $V_c$="1" (high), the FETs 2 and 3 are turned ON while the FETs 1 and 4 are in a high impedance state, so that the input port IN2 is connected to the output port OUT, as illustrated in FIG. 3B.

Figure 3B:
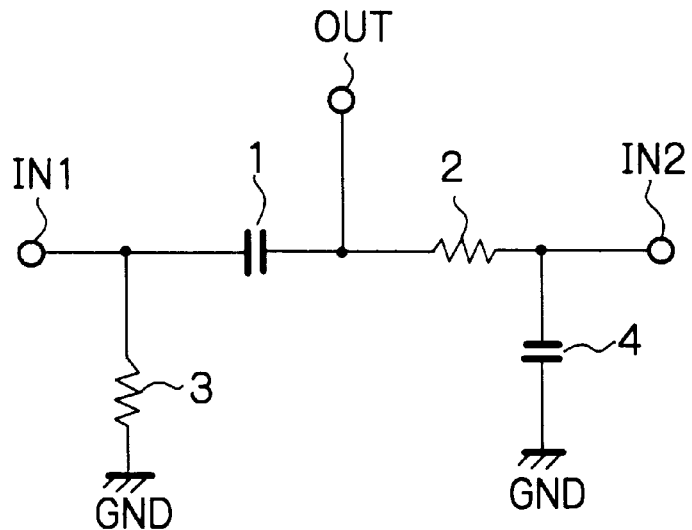

In the switch circuit of FIG. 1, since the mutual conductance $g_M$ and the transition frequency $f_t$ of the GaAs FETs are very high, it is easy to increase the fluctuation of the resistances in the equivalent circuits of FIGS. 3A and 3B. In addition, the capacitances of the capacitors in the equivalent circuits of FIGS. 3A and 3B in a high impedance state are so small that the isolation characteristics between the input port IN1 (IN2) and the output port OUT extend to a higher frequency.

Note that if the resistance values of the turned ON FETs 3 and 4 coincide with a characteristic impedance of the input/output terminal, such FETs serve as non-reflective terminals; however, this deteriorates the isolation characteristics of the output port OUT. Contrary to this, if the resistance values of the turned ON FETs 3 and 4 are brought close to zero, such FETs serve as total-reflective terminals to improve the isolation characteristics of the output port OUT; however, this affects the operation of a prestage circuit of the switch of FIG. 1.

Figure 4:
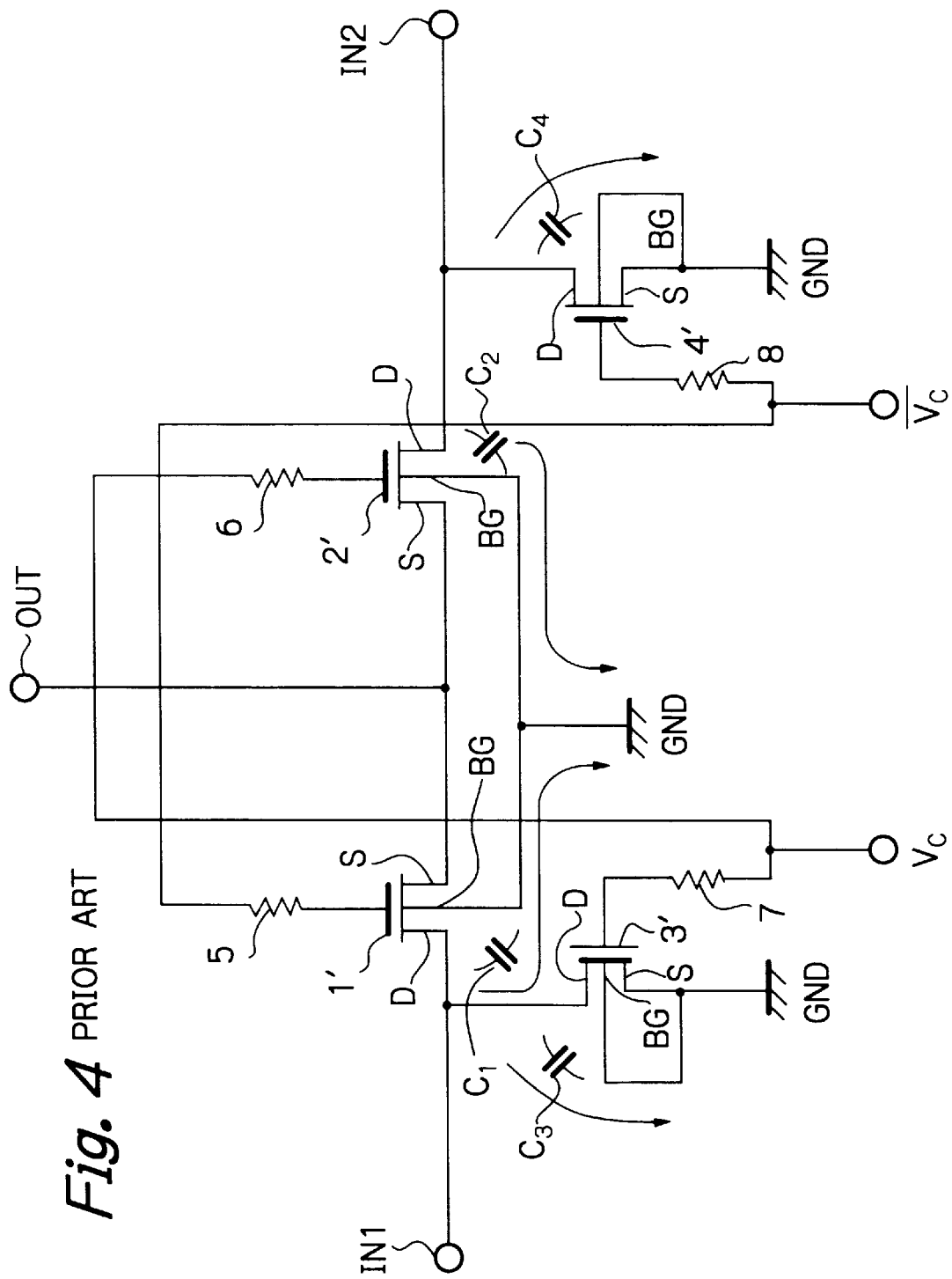
FIG. 4 is a circuit diagram illustrating a prior art Si SPDT switch circuit.

In FIG. 4, which illustrates a Si SPDT switch circuit (see: Y. Iwama et al) "L-Band SPDT Switch using Si-MOSFET" Technical Report of IEICE, SAT95-82, NW95-124 (1995-12), N-channel MOS transistors 1', 2', 3' and 4' are provided instead of the GaAs FETs 1, 2, 3 and 4, respectively, of FIG. 1.

Figure 5:
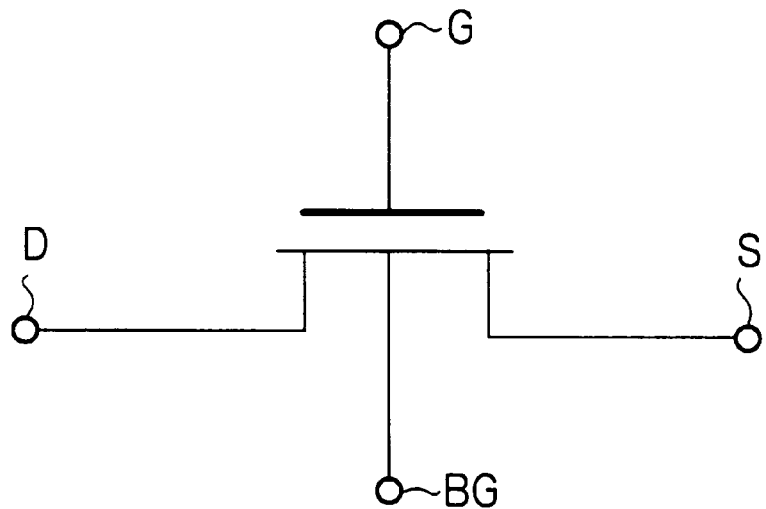
FIG. 5 is an equivalent circuit diagram of the Si FET of FIG. 4.
Figure 5:
Figure 5:
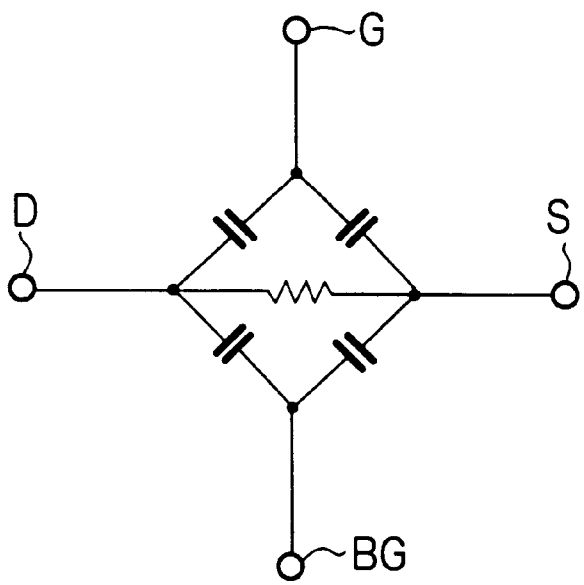

Since a substrate of the MOS transistors is made of conductive material, each of the MOS transistors is of a four-terminal type which has a source S, a drain D, a gate G and a back gate electrode BG for fixing the substrate potential (or the well potential) at a definite voltage. Note that, if the MOS transistors are of an N-type, the back gates thereof are fixed at the lowest voltage, i.e., the ground voltage. Therefore, as illustrated in FIG. 5, each of the MOS transistors can be represented by a resistor between the source S and the drain D, a capacitor between the source S and as the gate G, a capacitor between the drain D and the gate G, a capacitor between the source S and the back gate BG and a capacitor between the drain D and the back gate BG.

Figure 6A:
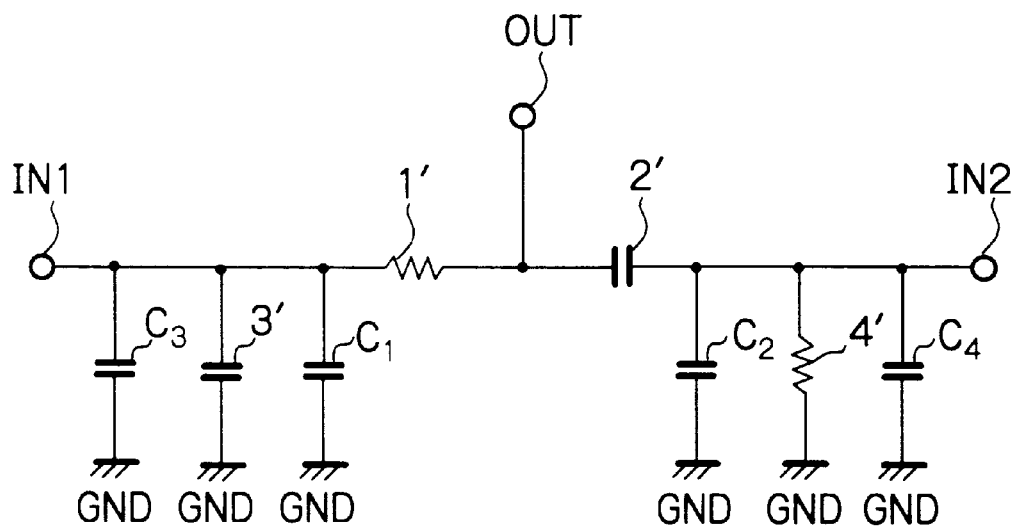
FIGS. 6A and 6B are equivalent circuit diagrams of the switch circuit of FIG. 4.

In FIG. 4, when $\overline{V}_c$="1" (high), the MOS transistors 1' and 4' are turned ON while the MOS transistors 2 and 3 are in a high impedance state, so that the input port IN1 is connected to the output port OUT, as illustrated in FIG. 6A. On the other hand, when $V_c$ ="1" (high), the MOS transistors 2' and 3' are turned ON while the MOS transistors 1' and 4' are in a high impedance state, so that the input port IN2 is connected to the output port OUT, as illustrated in FIG. 6B.

Figure 6B:
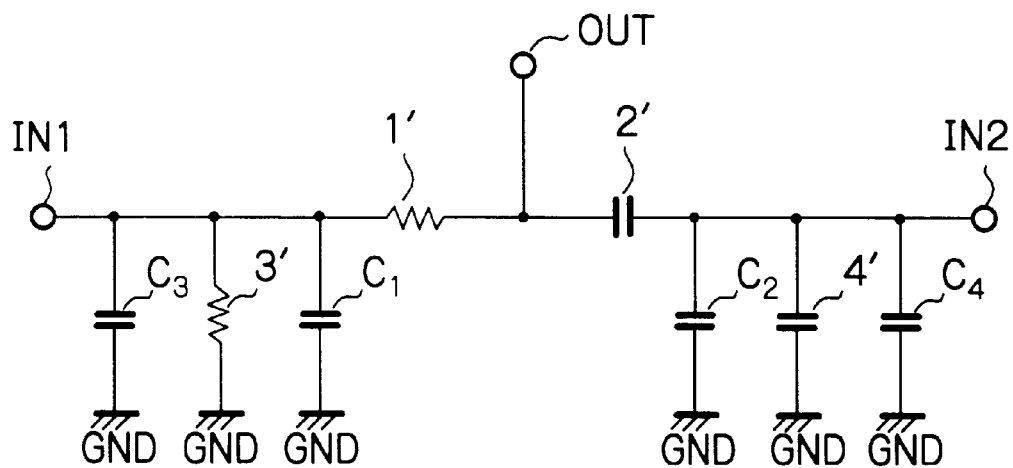

As illustrated in FIGS. 6A and 6B, capacitances $C_1$, $C_2$, $C_3$ and $C_4$ of the MOS transistors 1' to 4' serve as bypass capacitors of radio frequency signals at the input ports IN1 and IN2 to the ground terminal GND. Particularly, when the size of the MOS transistors 1' to 4' is reduced to decrease the resistances thereof, the capacitances of such bypass capacitors become remarkably large, which remarkably increases the transmission loss of the radio frequency signals from the input port IN1 (IN2) to the output port OUT.

Figure 7:
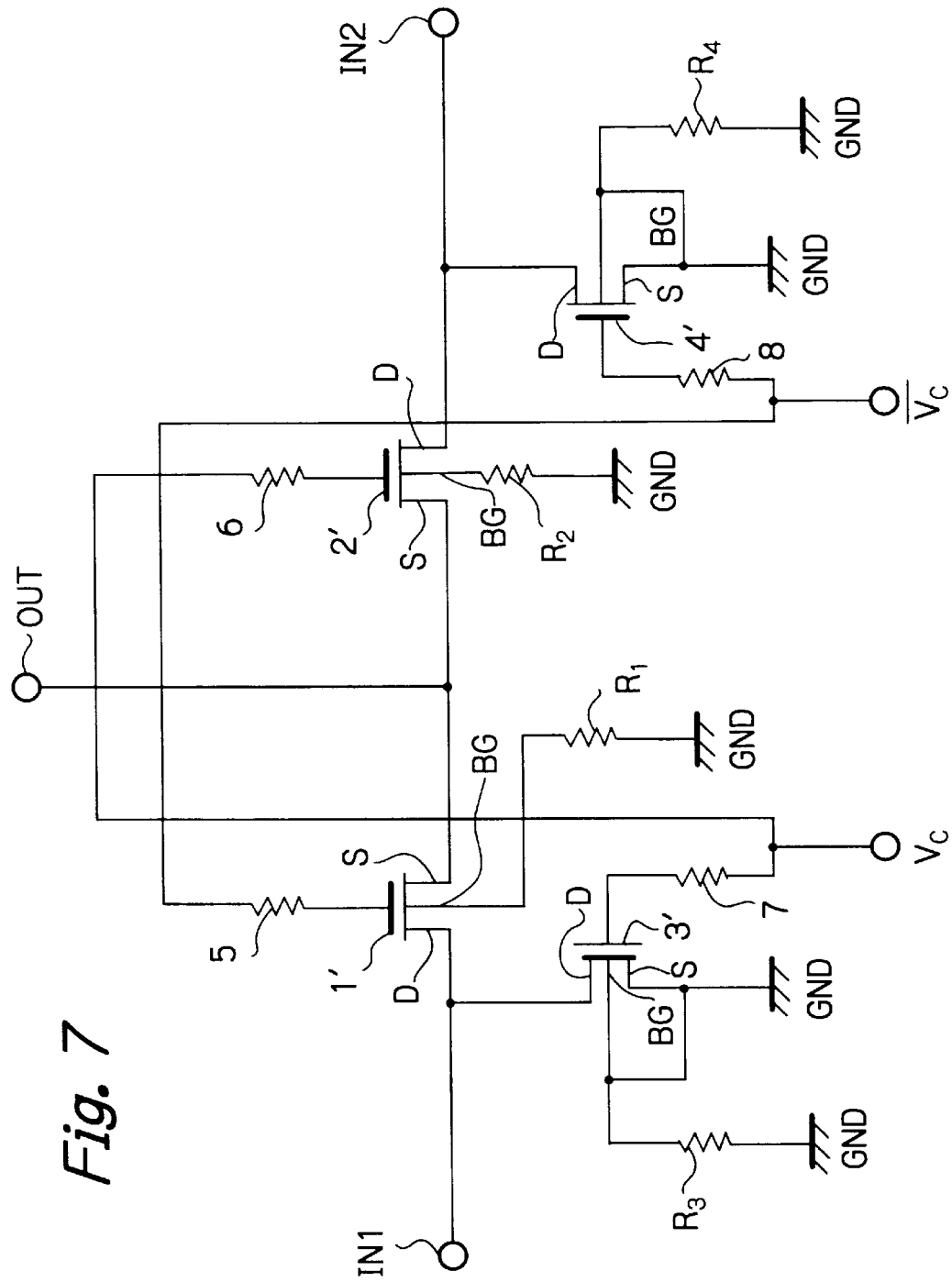
FIG. 7 is a circuit diagram illustrating a first embodiment of the radio frequency switch according to the present invention.
Figure 8:
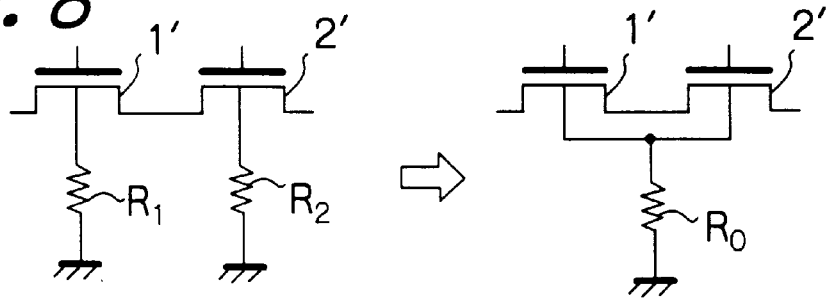
FIG. 8 is a circuit diagram illustrating a modification of the switch circuit or FIG. 7.

In FIG. 7, which illustrates a first embodiment of the present invention, resistors $R_1$, $R_2$, $R_3$ and $R_4$ are added to the elements of FIG. 4. The resistor $R_1$ is connected between the back gate of the MOS transistor 1' and the ground terminal GND. The resistor $R_2$ is connected between the back gate of the MOS transistor 2' and the ground terminal GND. The resistor $R_3$ is connected between the back gate of the MOS transistor 3' and the ground terminal GND. The resistor $R_4$ is connected between the back gate of the MOS transistor 4' and the ground terminal GND. In this case, as illustrated in FIG. 8, the resistors $R_1$ and $R_2$ can be combined into one resistor $R_0$. Also, two or more of the resistors $R_0$, $R_1$, $R_2$ and $R_3$ can be combined into one resistor.

Figure 9:
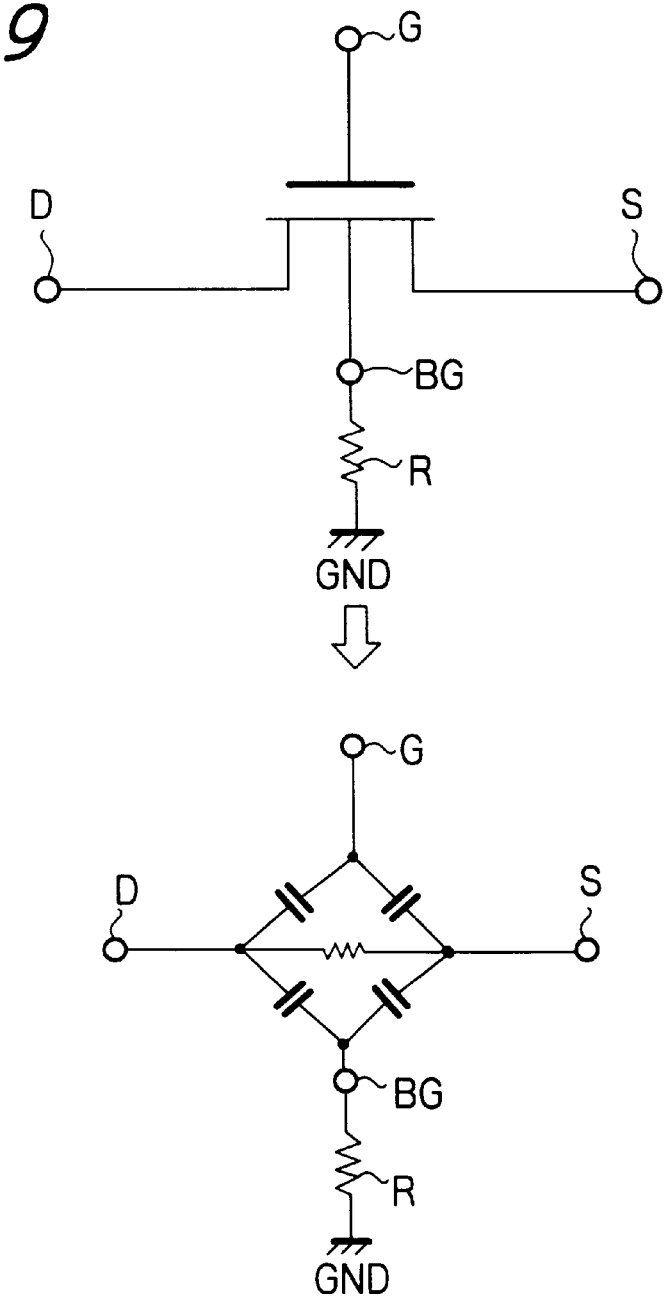
FIG. 9 is an equivalent circuit diagram of the Si FET of FIG. 7.

The impedance value of each of the resistors $R_1$, $R_2$, $R_3$ and $R_4$ is sufficiently larger than those of the capacitances $C_1$, $C_2$, $C_3$ and $C_4$ of FIGS. 4, 6A and 6B. Therefore, as illustrated in FIG. 9, each of the MOS transistors including the resistors such as $R_1$ can be represented by a resistor between the source S and the drain D, a capacitor between the source S and the gate G, a capacitor between the drain D and the gate G and a resistor between the back gate BG and the ground terminal GND.

Figure 10A:
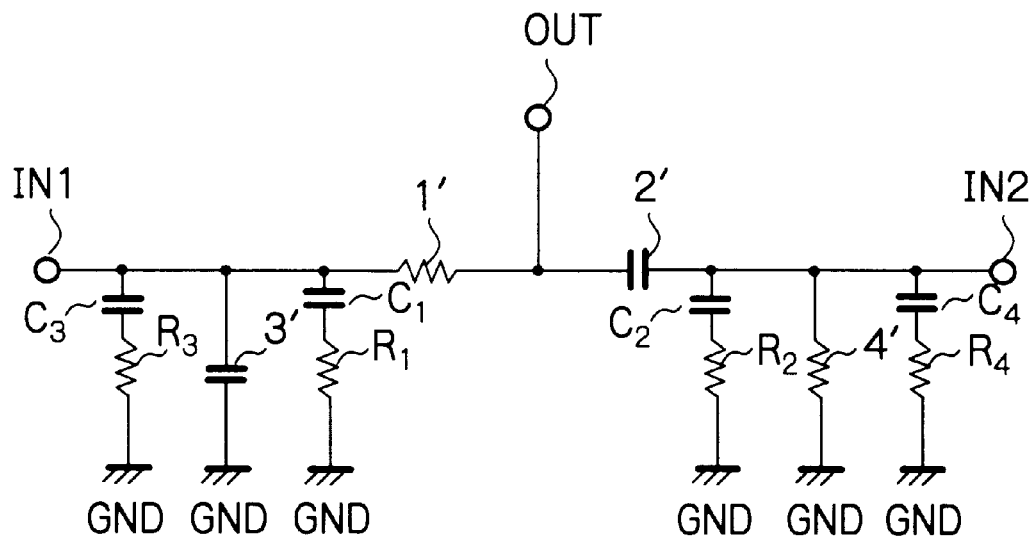
FIGS. 10A, 10B, 11A and 11B are equivalent circuit diagrams of the switch circuit of FIG. 7.
Figure 10B:
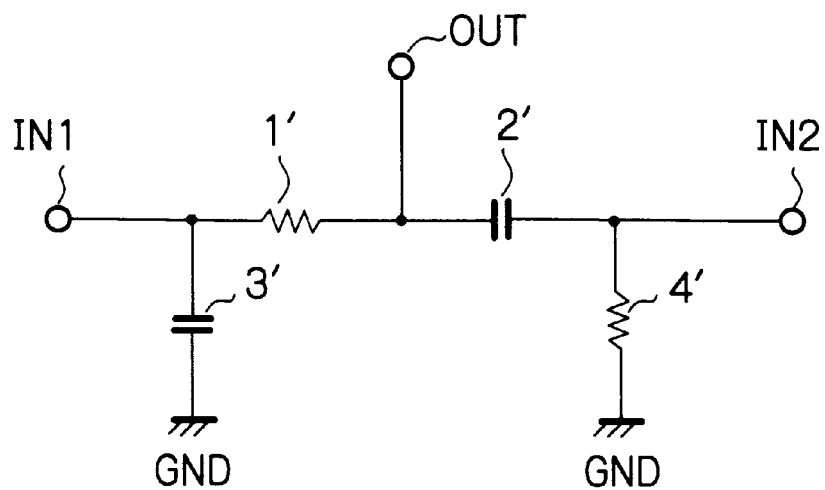

In FIG. 7, when $\overline{V}_c$="1" (high), the MOS transistors 1' and 4' are turned ON while the MOS transistors 2' and 3' are in a high impedance state, so that the input port IN1 is connected to the output port OUT and the input port IN2 is disconnected from the output port OUT, as illustrated in FIG. 10A. That is, if a transmitter is connected to the input port IN1 a receiver is connected to the input port IN2, and an antenna is connected to the output port OUT, the transmitter is in a transmitting state, so that a radio frequency signal is transmitted from the input port IN1 to the output port OUT. In this case, since the impedance between the input port IN1 and the ground terminal GND is very large due to the large resistances of the resistors $R_1$, and $R_3$ as well as the high impedance of the MOS transistor 3', the radio frequency signal hardly leaks from the input port IN1 to the ground terminal GND. Also, the ON resistance of the MOS transistor 4' is quite small as compared with those of the resistors $R_2$ and $R_4$. Further, even if the resistors $R_1$ and $R_3$ are connected between the input port IN1 and the ground terminal GND, no DC current flows therethrough, since a reverse bias is applied between the input port IN1 and the ground terminal GND. Therefore, the equivalent circuit of FIG. 10A can be represented by an equivalent circuit as illustrated in FIG. 10B which is similar to FIG. 3A.

Figure 11A:
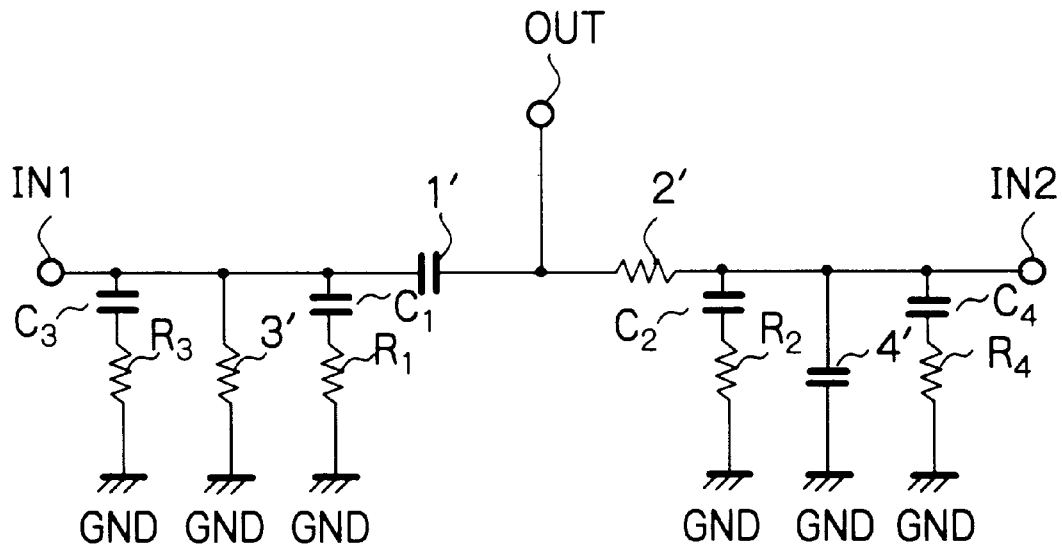
Figure 11B:
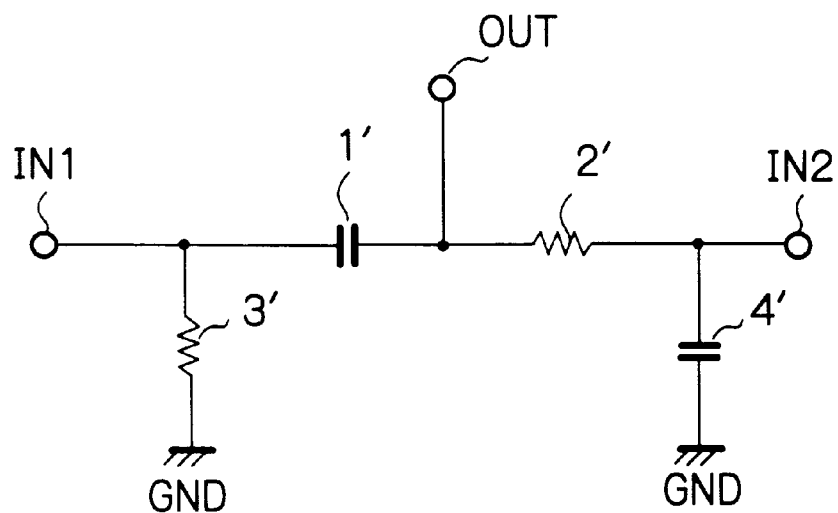

On the other hand, in FIG. 7, when $V_c$="1" (high), the MOS transistors 2' and 3' are turned ON while the MOS transistors 1' and 4' are in a high impedance state, so that the input port IN2 is connected to the output port OUT and the input port IN1 is disconnected from the output port OUT, as illustrated in FIG. 11A. That is, if a transmitter is connected to the input port IN1 a receiver is connected to the input port IN2, and an antenna is connected to the output port OUT, the receiver is in a receiving state, so that a radio frequency signal is transmitted from the output port OUT to the input port IN2. In this case, since the impedance between the input port IN2 and the ground terminal GND is very large due to the resistances of the resistors $R_2$, and $R_4$ as well as the high impedance of the MOS transistor 4', the radio frequency signal hardly leaks to the ground terminal GND. Also, the ON resistance of the MOS transistor 3' is quite small as compared with those of the resistors $R_1$ and $R_3$. Further, even if the resistors $R_2$ and $R_4$ are connected between the input port IN2 and the ground terminal GND, no DC current flows therethrough, since a reverse bias is applied between the input port IN2 and the ground terminal GND. Therefore, the equivalent circuit of FIG. 11A can be represented by an equivalent circuit as illustrated in FIG. 11B which is similar to FIG. 3E.

In FIG. 7, the resistors 5 to 8 are helpful in decreasing the transmission loss of a radio frequency signal due to a capacitance between the drain (source) and gate of each MOS transistor.

Figure 12:
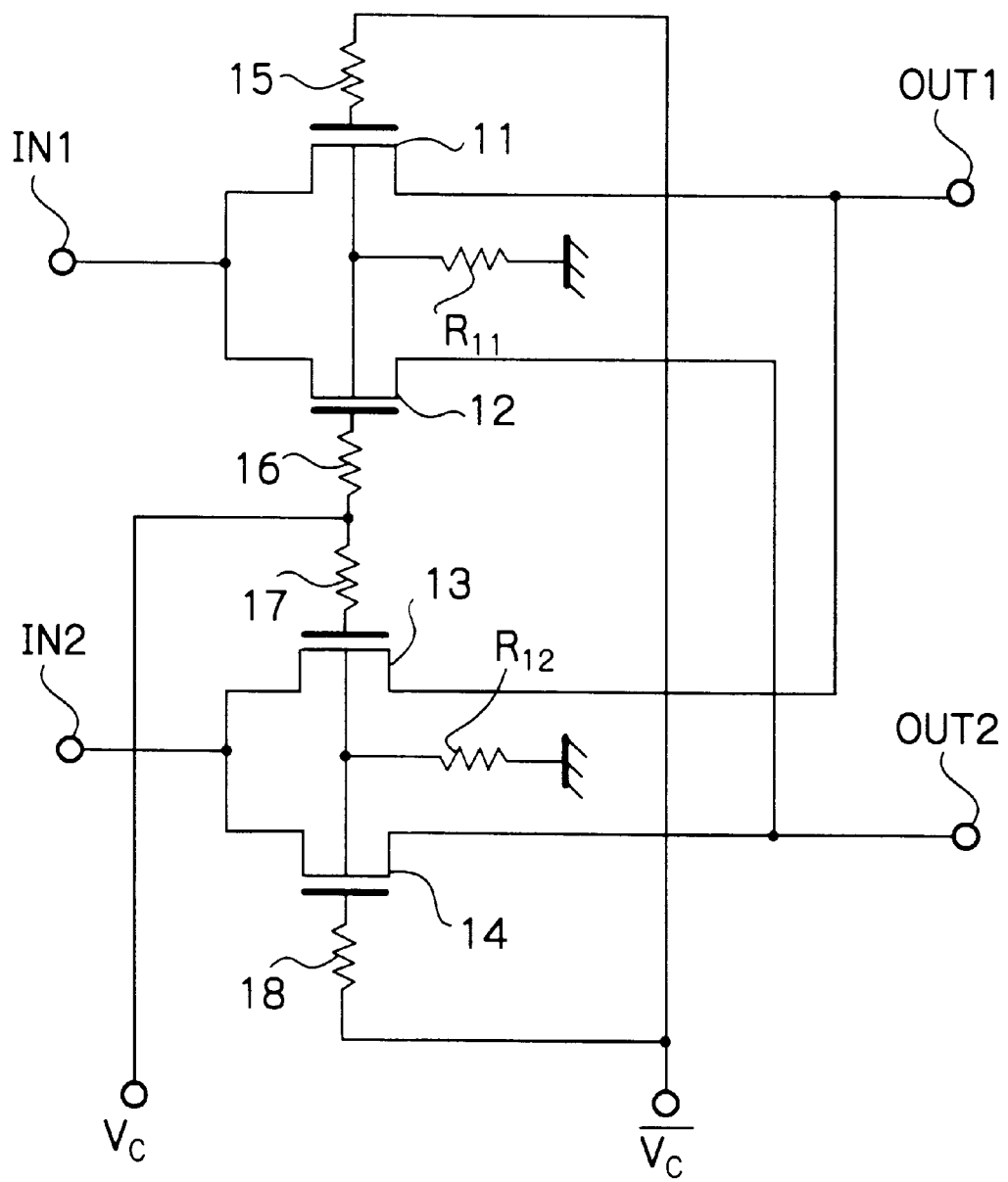
FIG. 12 is a circuit diagram illustrating a second embodiment of the radio frequency switch circuit according to the present invention.

In FIG. 12, which illustrates a second embodiment of the invention, a double pole dual throw (DPDT) switch circuit is illustrated. That is, an N-channel MOS transistor 11 is connected between an input port IN1 and an output port OUT1. An N-channel MOS transistor 12 is connected between an input port IN1 and an output port OUT2. An N-channel MOS transistor 13 is connected between an input port IN2 and an output port OUT1. An N-channel MOS transistor 14 is connected between an input port IN2 and an output port OUT2. Also, resistors 15, 16, 17 and 18 are connected to gates of the transistors 11, 12, 13 and 14, respectively. Therefore, the transistors 12 and 13 are controlled via the resistors 16 and 17 by a control voltage $V_c$ and the transistors 11 and 14 are controlled via the resistors 15 and 18 by a control voltage $\overline{V}_c$.

Further, a resistor $R_{11}$ is connected between back gate of the transistors 11 and 12 the ground terminal GND, and a resistor $R_{12}$ is connected between back gates of the transistors 13 and 14 and the ground terminal GND. Note that one resistor can be connected to the back gate of each of the transistors 11, 12, 13 and 14, In FIG. 12, when $\overline{V}_c$="1" (high), the MOS transistors 11 and 14 are turned ON while the MOS transistors 12 and 13 are in a high impedance state, so that the input port IN1 is connected to the output port OUT1 and the input port IN2 is connected to the output port OUT2. In this case, since the impedance between the input port IN1 and the ground terminal GND is very large due to the large resistance of the resistor $R_{11}$ as well as the high impedance of the MOS transistor 12, a radio frequency signal hardly leaks from the input port IN1 to the ground terminal GND. Similarly, a radio frequency signal hardly leaks from the input port IN2 to the ground GND. Also, the ON resistance of the MOS transistor 11 (14) is quite small as compared with that of the resistor $R_{11}$ ($R_{12}$). Further, even if the resistor $R_{11}$ ($R_{12}$) is connected between the input port IN1 (IN2) and the ground terminal GND, no DC current flows therethrough, since a reverse bias is applied between the input port IN1 (IN2) and the ground terminal GND.

On the other hand, in FIG. 12, when $V_c$"1" (high), the MOS transistors 12 and 13 are turned ON while the MOS transistors 11 and 14 are in a high impedance state, so that the input port IN1 is connected to the output port OUT2 and the input port IN2 is connected to the output port OUT1. In this case, since the impedance between the input port IN1 and the ground terminal GND is very large due to the large resistance of the resistor $R_{11}$ as well as the high impedance of the MOS transistor 11, a radio frequency signal hardly leaks from the input port IN1 to the ground terminal GND. Similarly, a radio frequency signal hardly leaks from the input port IN2 to the ground GND. Also, the ON resistance of the MOS transistor 12 (13) is so small as compared with that of the resistor $R_{11}$ ($R_{12}$). Further, even if the resistor $R_{11}$ ($R_{12}$) is connected between the input port IN1 (IN2) and the ground terminal GND, no DC current flows therethrough, since a reverse bias is applied between the input port IN1 (IN2) and the ground terminal GND.

Figure 13:
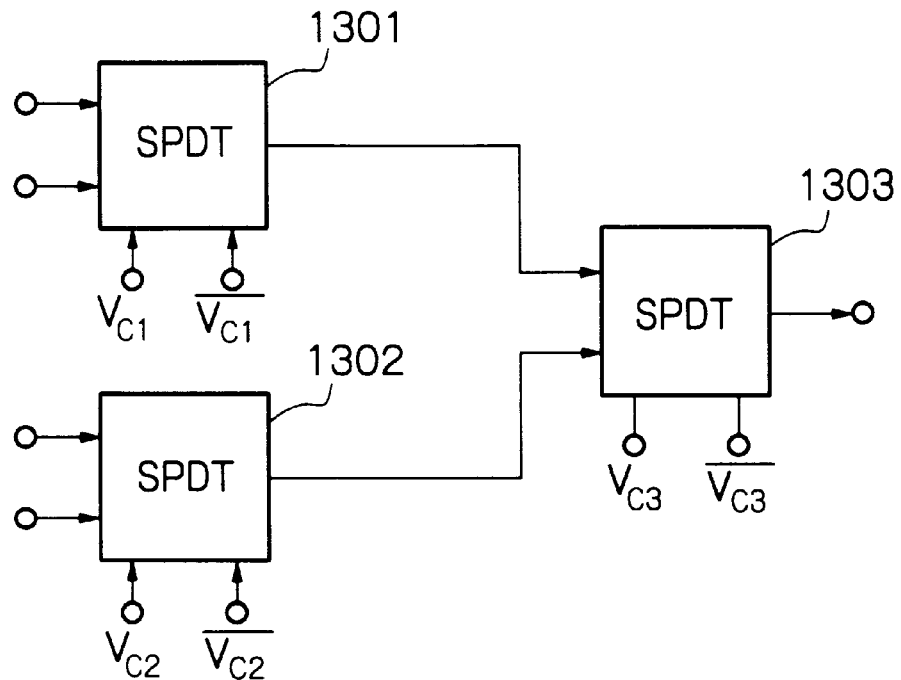
FIG. 13 and 14 are block circuit diagrams of switch circuits to which the first embodiment of FIG. 7 is applied.
Figure 14:
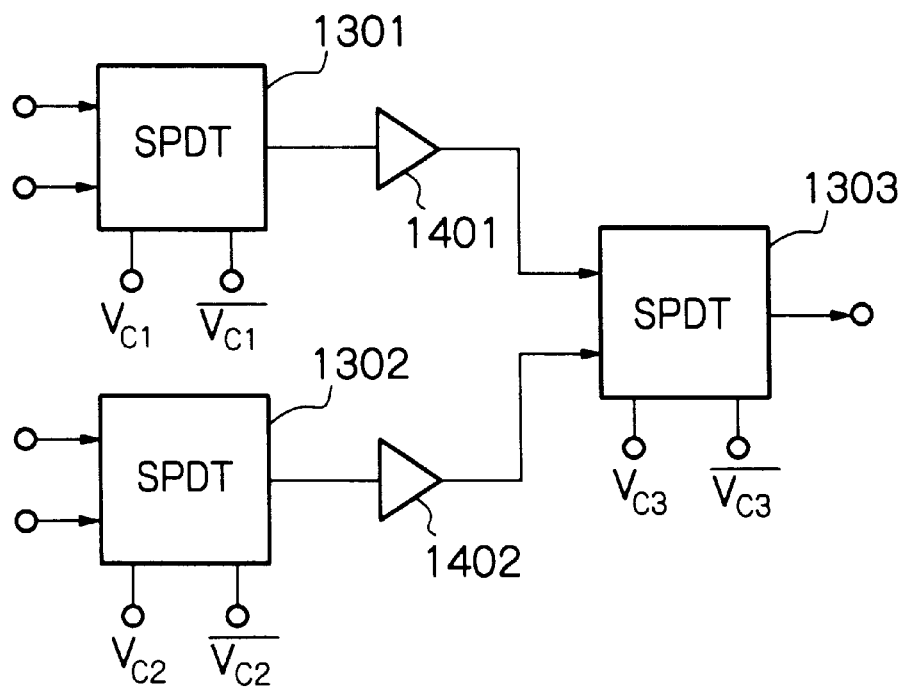

In FIG. 13, three SPDT switches 1301, 1302 and 1303 each having the same configuration as the SPDT switch circuit of FIG. 7 are provided, thus realizing a single pole four throw switch circuit. Also, in FIG. 14, an amplifier 1401 is connected between the SPDT switches 1301 and 1303 of FIG. 13, and an amplifier 1402 is connected between the SPDT switches 1302 and 1303 of FIG. 13. The amplifiers 1401 and 1402 amplify the output radio frequency signals of the SPDT switches 1301 and 1302, thus compensating for the transmission loss thereof.

Note that four or more SPDT switches having the same configuration as that of FIG. 7 can be combined to realize various types of switch circuits.

Figure 15:
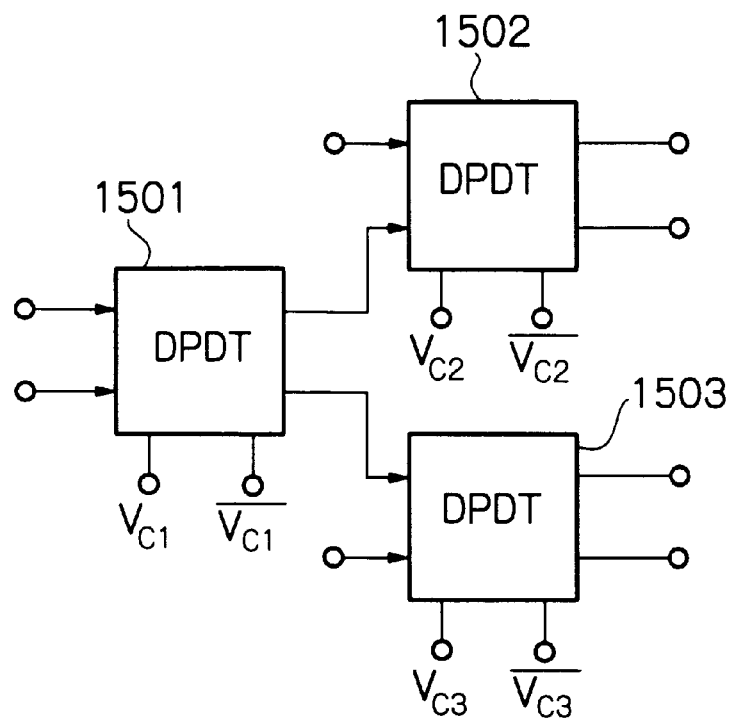
FIGS. 15 and 16 are block circuit diagrams of switch circuits to which the second embodiment of FIG. 12 is applied.
Figure 16:
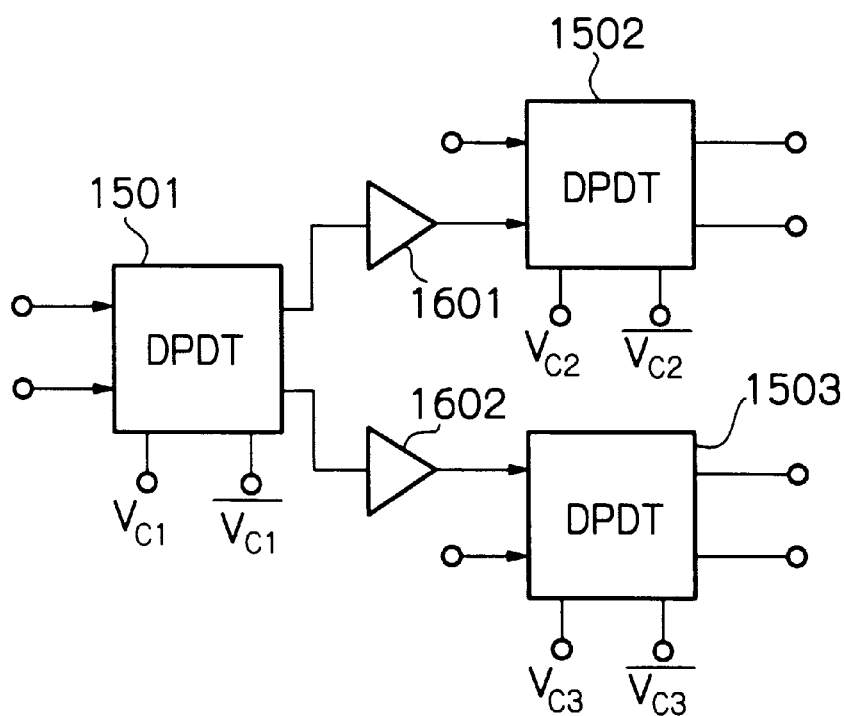

In FIG. 15, three DPDT switches 1501, 1502 and 1503 each having the same configuration as the DPDT switch circuit of FIG. 12 are provided, thus realizing a four pole dual throw switch circuit. Also, in FIG. 16, an amplifier 1601 is connected between the DPDT switches 1501 and 1502 of FIG. 13, and an amplifier 1602 is connected between the DPDT switches 1501 and 1503 of FIG. 15. The amplifiers 1601 and 1602 amplify the output radio frequency signals of the DPDT switch 1501, thus compensating for the transmission loss thereof.

Note that four or more DPDT switches having the same configuration as that of FIG. 12 can be combined to realize various types of switch circuits.

Figure 17:
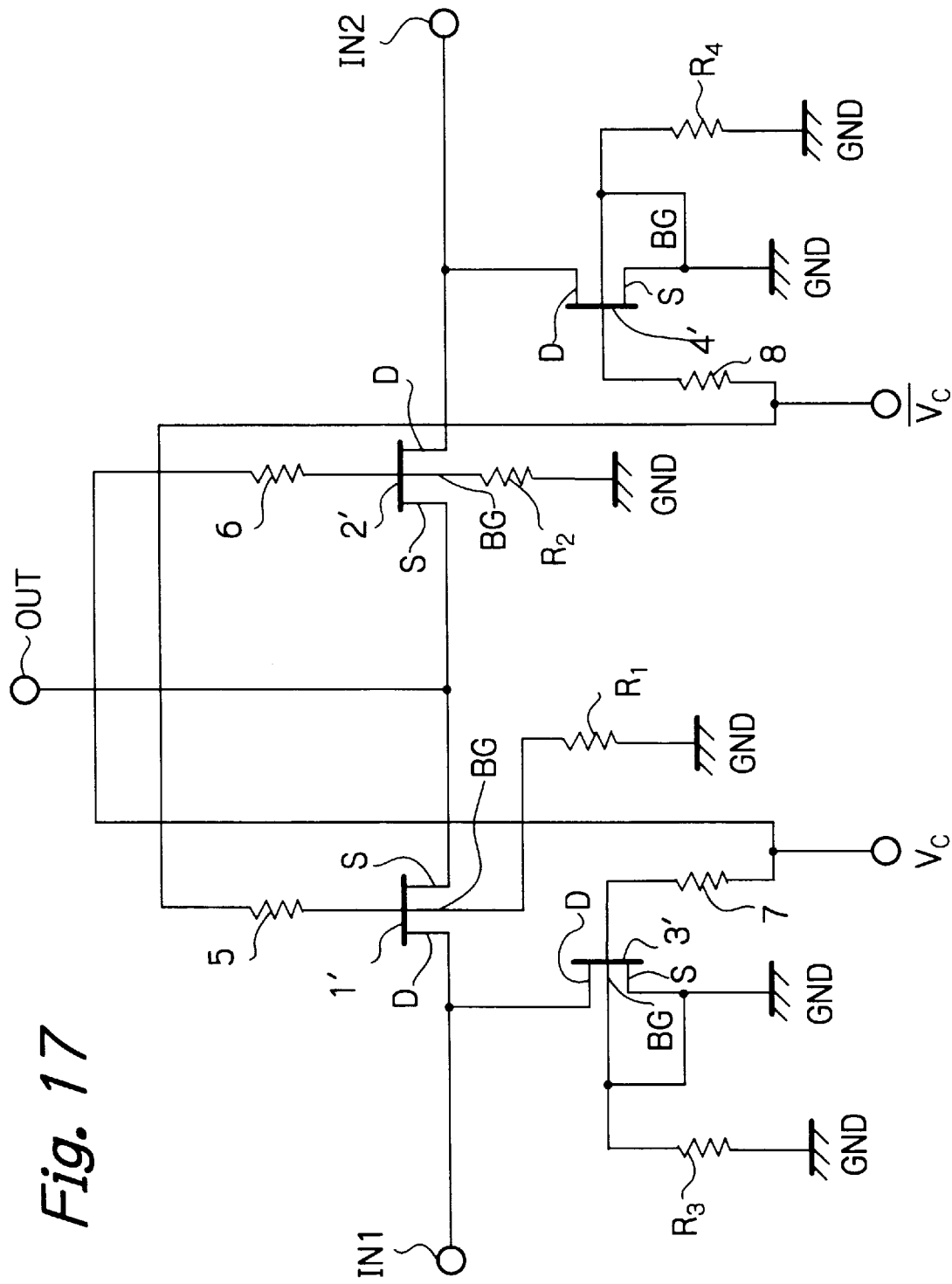
FIGS. 17 and 18 are circuit diagrams illustrating modifications of the switch circuits of FIGS. 7 and 12, respectively.
Figure 18:
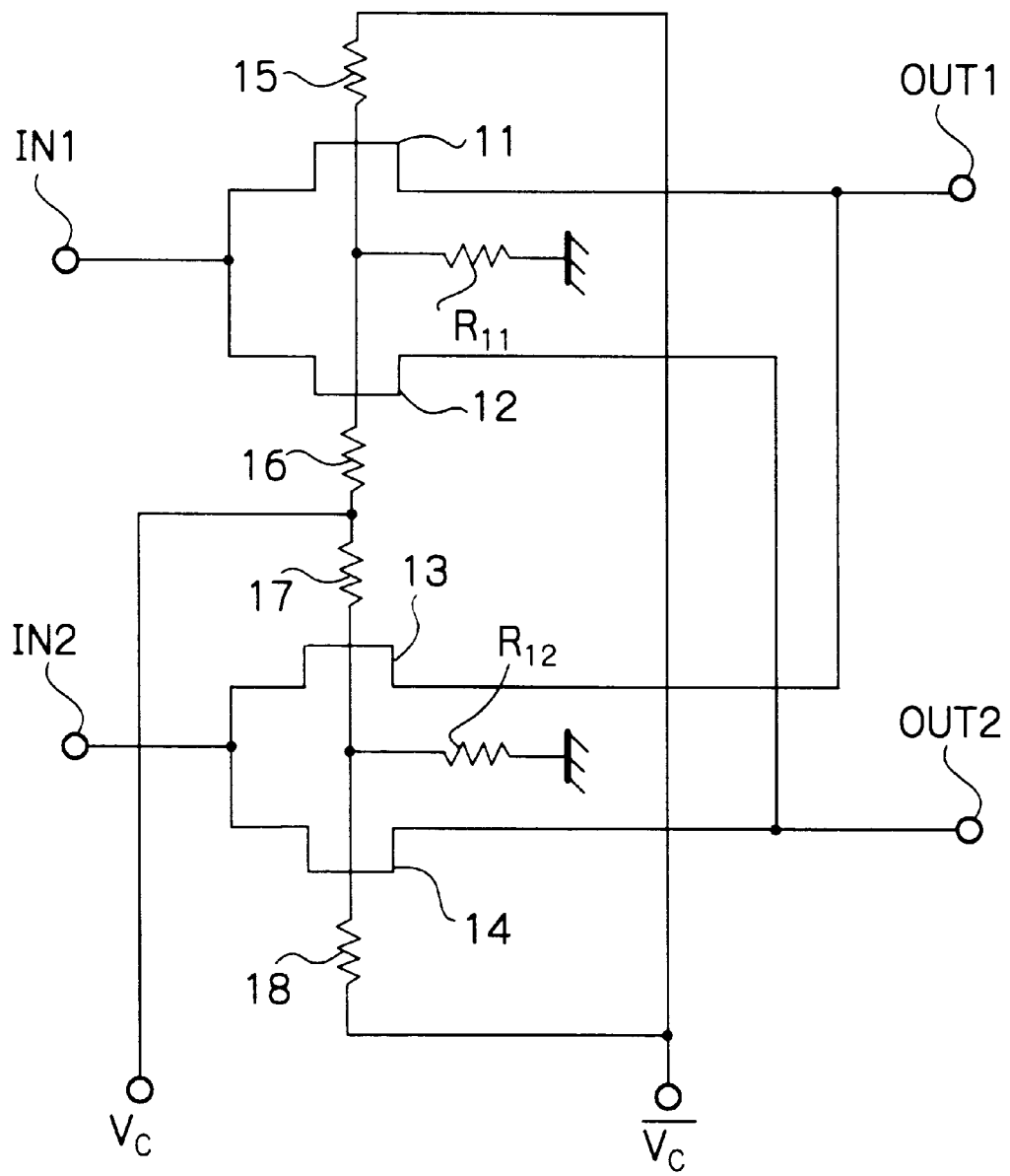

In the above-mentioned embodiments, the transistors 1', 2', 3', 4', 11, 12, 13 and 14 are N-channel MOS transistors using silicon, however, the transistors 1', 2', 3', 4', 11, 12, 13 and 14 can be replaced by junction field effect transistors using silicon as illustrated in FIGS. 17 and 18 which are modifications of the switch circuits of FIGS. 7 and 12, respectively.

Figure 19:
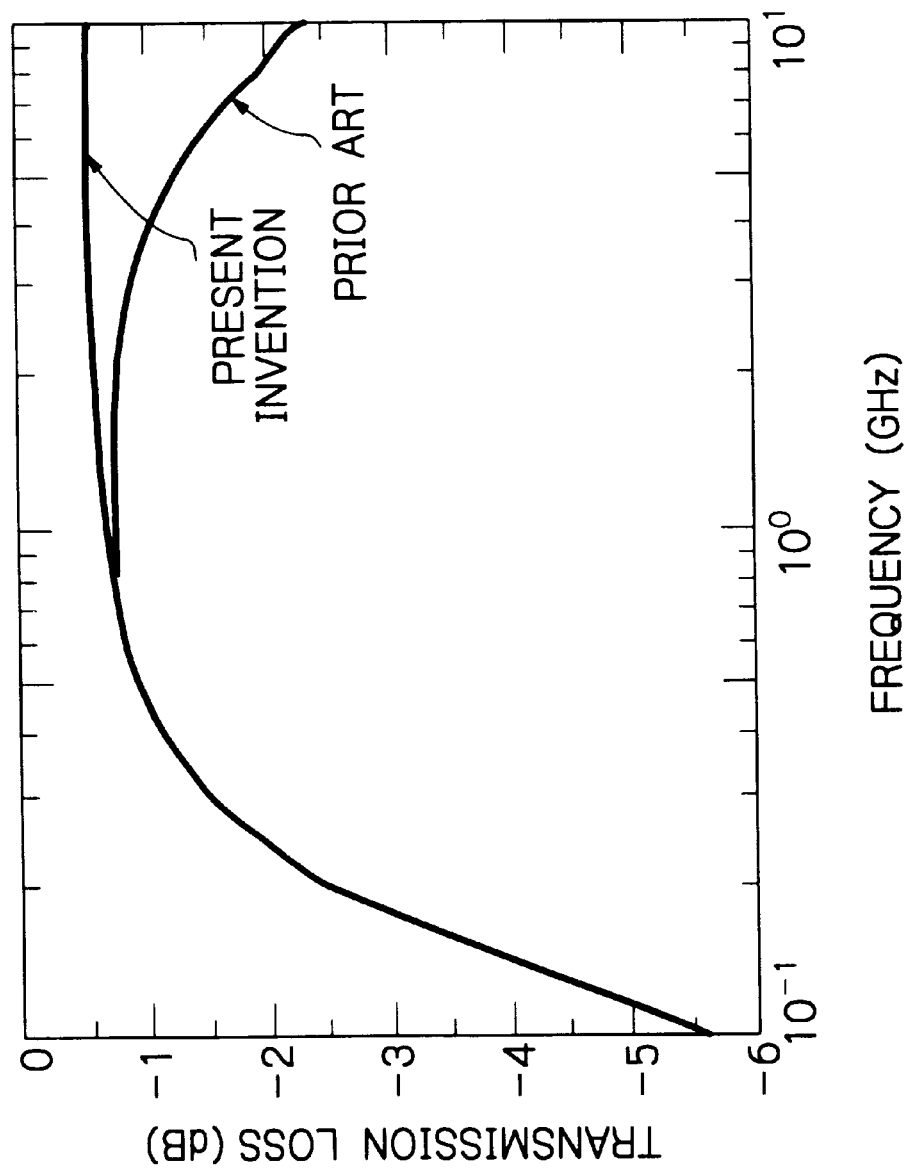
FIG. 19 is a graph showing the effect according to the present invention.

In FIG. 19, which shows the effect of the present invention, particularly, the first embodiment of FIG. 7 as compared with the prior art of FIG. 4, when the frequency of input/output signals is larger than $10^0$ (=1) GHz, the transmission loss is not decreased in the present invention, while the transmission loss is decreased in the prior art. Note that, when the frequency of input/output signals is smaller than 1 GHz, the transmission loss is increased, because a bypass capacitor for cutting off a DC component is interposed in a signal path. Therefore, if the capacitance of such a bypass capacitor is increased, the transmission can be decreased.

As explained hereinabove, according to the present invention, since a resistor whose impedance is sufficiently large is connected to a back gate of each MOS transistor or junction FET using silicon, the transmission loss of radio frequency signals due to the capacitances between the source (or drain) and the back gate of the MOS transistor or junction FET can be decreased.

What is claimed is:

1. A switch circuit comprising:

first, second and third terminals;

a ground terminal;

a first transistor connected between said first and third terminals;

a second transistor connected between said second and third terminals;

a third transistor connected between said first terminal and said ground terminal;

a fourth transistor connected between said second terminal and said ground terminal;

a first resistor connected between a back gate of said first transistor and said ground terminal;

a second resistor connected between a back gate of said second transistor and said ground terminal;

a third resistor connected between a back gate of said third transistor and said ground terminal;

a fourth resistor connected between a back gate of said fourth transistor and said ground terminal;

gates of said first, second, third and fourth transistors being controlled by control voltages.

2. The switch circuit as set forth in claim 1, further comprising fifth, sixth, seventh and eight resistors connected to the gates of said first, second, third and fourth transistors, respectively, said control voltages being supplied via said fifth, sixth, seventh and eight resistors to the gates of said first, second, third and fourth transistors.

3. The switch circuit as set forth in claim 1, wherein each of said first, second, third and fourth transistors comprises a MOS transistor using silicon.

4. The switch circuit as set forth in claim 1, wherein each of said first, second, third and fourth transistors comprises a junction field effect transistor using silicon.

5. A switch circuit comprising:

first, second, third and fourth terminals;

a ground terminal;

a first transistor connected between said first and third terminals;

a second transistor connected between said first and third terminals;

a third transistor connected between said second and fourth terminals;

a fourth transistor connected between said second and fourth terminals;

a first resistor connected between a back gate of said first transistor and said ground terminal;

a second resistor connected between a back gate of said second transistor and said ground terminal;

a third resistor connected between a back gate of said third transistor and said ground terminal;

a fourth resistor connected between a back gate of said fourth transistor and said ground terminal;

gates of said first, second, third and fourth transistors being controlled by control voltages.

6. The switch circuit as set forth in claim 5, further comprising fifth, sixth, seventh and eight resistors connected to the gates of said first, second, third and fourth transistors, respectively, said control voltages being supplied via said fifth, sixth, seventh and eight resistors to the gates of said first, second, third and fourth transistors.

7. The switch circuit as set forth in claim 5, wherein each of said first, second, third and fourth transistors comprises a MOS transistor using silicon.

8. The switch circuit as set forth in claim 5, wherein each of said first, second, third and fourth transistors comprises a junction field effect transistor using silicon.

9. A switch circuit comprising a plurality of switches each having first and second inputs and one output, the first and second inputs of one of said switches being connected to the outputs of two other ones of said switches, each of said switches comprising:

a first transistor connected between said first input and said output;

a second transistor connected between said second input and said output;

a third transistor connected between said first input terminal and a ground terminal;

a fourth transistor connected between said second terminal and said ground terminal;

a first resistor connected between a back gate of said first transistor and said ground terminal;

a second resistor connected between a back gate of said second transistor and said ground terminal;

a third resistor connected between a back gate of said third transistor and said ground terminal;

a fourth resistor connected between a back gate of said fourth transistor and said ground terminal;

gates of said first, second, third and fourth transistors being controlled by control voltages.

10. The switch circuit as set forth in claim 9, wherein each of said switches further comprises fifth, sixth, seventh and eight resistors connected to the gates of said first, second, third and fourth transistors, respectively, said control voltages being supplied via said fifth, sixth, seventh and eight resistors to the gates of said first, second, third and fourth transistors.

11. The switch circuit as set forth in claim 9, wherein each of said first, second, third and fourth transistors comprises a MOS transistor using silicon.

12. The switch circuit as set forth in claim 9, wherein each of said first, second, third and fourth transistors comprises a junction field effect transistor using silicon.

13. A switch circuit comprising a plurality of switches each having first and second input and first and second outputs, one of the first and second outputs of one of said switches being connected to one of the first and second inputs of another of said switches, each of said switches comprising:

a first transistor connected between said first input and said first output;

a second transistor connected between said first input and said second output;

a third transistor connected between said second input and said first output;

a fourth transistor connected between said second input and said second output;

a first resistor connected between a back gate of said first transistor and a ground terminal;

a second resistor connected between a back gate of said second transistor and said ground terminal;

a third resistor connected between a back gate of said third transistor and said ground terminal;

a fourth resistor connected between a back gate of said fourth transistor and said ground terminal;

gates of said first, second, third and fourth transistors being controlled by control voltages.

14. The switch circuit as set forth in claim 13, wherein each of said switches further comprises fifth, sixth, seventh and eighth resistors connected to the gates of said first, second, third and fourth transistors, respectively, said control voltages being supplied via said fifth, sixth, seventh and eight resistors to the gates of said first, second, third and fourth transistors.

15. The switch circuit as set forth in claim 13, wherein each of said first, second, third and fourth transistors comprises a MOS transistor using silicon.

16. The switch circuit as set forth in claim 13, wherein each of said first, second, third and fourth transistors comprises a junction field effect transistor using silicon.

* * * * *